United States Patent
Chen et al.

(10) Patent No.: US 9,899,309 B2
(45) Date of Patent: Feb. 20, 2018

(54) ELECTRONIC PACKAGE AND SEMICONDUCTOR SUBSTRATE

(71) Applicant: Siliconware Precision Industries Co., Ltd., Taichung (TW)

(72) Inventors: Shih-Ching Chen, Taichung (TW);
Shih-Liang Peng, Taichung (TW);
Chieh-Lung Lai, Taichung (TW);
Jia-Wei Pan, Taichung (TW);
Chang-Lun Lu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/084,762

(22) Filed: Mar. 30, 2016

(65) Prior Publication Data
US 2017/0256481 A1     Sep. 7, 2017

(30) Foreign Application Priority Data

Mar. 4, 2016 (TW) .............................. 105106680 A

(51) Int. Cl.
*H01L 23/00* (2006.01)
*H01L 23/48* (2006.01)
*H01L 29/02* (2006.01)
*H01L 25/065* (2006.01)
*H01L 23/498* (2006.01)
(Continued)

(52) U.S. Cl.
CPC .... *H01L 23/49838* (2013.01); *H01L 21/4846* (2013.01); *H01L 23/3128* (2013.01); *H01L 23/3142* (2013.01); *H01L 23/49827* (2013.01); *H01L 23/49833* (2013.01); *H01L 24/17* (2013.01); *H01L 25/0655* (2013.01); *H01L 25/16* (2013.01); *H01L 2224/16227* (2013.01); *H01L 2224/16238* (2013.01); *H01L 2924/15151* (2013.01)

(58) Field of Classification Search
CPC ............. H01L 2924/3512; H01L 24/16; H01L 23/49838; H01L 2224/14179; H01L 24/17; H01L 2224/16113; H01L 23/3128; H01L 24/28; H01L 21/563; H01L 21/78; H01L 2924/14; H01L 2224/94; H01L 25/0657; H01L 23/49827; H01L 2225/06572; H01L 2224/17181; H01L 29/0657; H01L 25/0655; H01L 23/5386; H01L 2924/15151; H01L 2224/16238; H01L 2224/05568
See application file for complete search history.

(56) References Cited

U.S. PATENT DOCUMENTS

| 2008/0012095 A1* | 1/2008 | Lee .................... H01L 25/0657 257/618 |
| 2015/0130035 A1* | 5/2015 | Leow .................... H01L 21/561 257/666 |

FOREIGN PATENT DOCUMENTS

JP         63-29960     *   2/1988 ............. H01L 23/50

* cited by examiner

*Primary Examiner* — Jasmine Clark
(74) *Attorney, Agent, or Firm* — Mintz Levin Cohn Ferris Glovsky and Popeo, P.C.; Peter F. Corless; Steven M. Jensen

(57) ABSTRACT

A semiconductor substrate is provided, including a substrate body having a lateral surface, and a protruding structure extending outward from the lateral surface. The semiconductor substrate distributes stresses generated during a manufacturing process through the protruding structure, and is thus prevented from delamination or being cracked. An electronic package having the semiconductor substrate is also provided.

16 Claims, 6 Drawing Sheets

(51) Int. Cl.
*H01L 23/31* (2006.01)
*H01L 25/16* (2006.01)
*H01L 21/48* (2006.01)

ELECTRONIC PACKAGE AND SEMICONDUCTOR SUBSTRATE

CROSS-REFERENCE TO RELATED APPLICATION

This application claims under 35 U.S.C. § 119(a) the benefit of Taiwanese Patent Application No. 105106680 filed Mar. 4, 2016, the entire contents of which are incorporated herein by reference.

BACKGROUND

1. Technical Field

This disclosure relates to semiconductor packages, and, more particularly, to a semiconductor package and an electronic package having the semiconductor package that have an increased yield.

2. Description of Related Art

With the rapid development of electronic industry, electronic products have more and more versatile, high-performance functionalities. A variety of die packages come to the market, including a die scale package (CSP), a flip-die packaging module, such as a direct die attached (DCA) module or multi-die module (MCM), and a 3D IC die stack module.

FIG. 1 is a cross-sectional view of a 3D IC semiconductor package 1 according to the prior art. A plurality of semiconductor dies 11 are disposed on a through silicon interposer (TSI) 10 via a plurality of solder bumps 110. An encapsulation layer 12 is formed on the through silicon interposer 10 to encapsulate the semiconductor die 11. The through silicon interposer 10 has a plurality of through-silicon vias (TSVs) 100, and a distribution layer (RDL) 101 formed on the TSVs 100 and electrically connected to the solder bumps 110. The through silicon interposer 10 is coupled via the through-silicon vias 100 and a plurality of conductive elements 130 to a packaging substrate 13. An underfill 14 encapsulates the conductive elements 130.

In the semiconductor package 1, the through silicon interposer 10 has four right-angle corners, as shown in FIG. 1'. After the through silicon interposer 10 is packaged, greater die corner stresses will be formed at the corners due to stress concentration, and a strong stress will be formed between the through silicon interposer 10 and the encapsulation layer 12, as indicated by dashed circles S of FIG. 1'. Therefore, the through silicon interposer 10 is likely cracked along the four corners, or delaminated from the encapsulation layer 12 due to coefficient of thermal expansion (CTE) mismatch, i.e., a delamination problem. As a result, the through silicon interposer 10 cannot be electrically connected to the semiconductor die 11 effectively, or pass the reliability test, and has a poor product yield.

After the through silicon interposer 10 is packaged, a strong stress will also be formed among the four corners and the underfill 14, as indicated by dashed circles K of FIG. 1. As a result, the through silicon interposer 10 will be likely cracked along the four corners, or delaminated from the underfill 14, and also has a poor product yield.

Therefore, how to solve the above problems of the prior art is becoming the urgent issues in the art.

SUMMARY

In light of the problems of the prior art, the present disclosure provides a semiconductor substrate, including: a substrate body having at least one lateral surface; and at least one protruding structure protruding outward from the lateral surface of the substrate body.

The present disclosure further provides an electronic package, comprising: a semiconductor substrate having a substrate body and at least one protruding structure extending outward from a lateral surface of the substrate body; an electronic component disposed on the semiconductor substrate; and an encapsulation layer formed on the semiconductor substrate and encapsulating the electronic component.

In an embodiment, the semiconductor substrate has a plurality of circuits electrically connected to the electronic component.

In an embodiment, the electronic package further comprises a packaging substrate disposed on a side opposing another side of the semiconductor substrate with the electronic component is disposed thereon. In another embodiment, the electronic package further comprises an underfill formed between the packaging substrate and the semiconductor substrate.

In an embodiment, the substrate body has a plurality of the lateral surfaces intersecting to form a corner, and the protruding structure is disposed on the corner.

In an embodiment, the protruding structure is integrated with the substrate body.

In an embodiment, the contour of the protruding structure is composed of straight lines, curved lines, or a combination thereof.

In an embodiment, the protruding structure includes a neck portion connected to the lateral surface of the substrate body, and a head portion connected to the neck portion.

It is known from the above that the electronic package and the semiconductor substrate according to the present disclosure use the protruding structure to distribute the stresses formed between the semiconductor substrate and the encapsulation layer (or the underfill), such that the stresses will not be concentrated on the corners. Therefore, the semiconductor substrate, after packaged, is prevented from being cracked or delaminated from the encapsulation layer or the underfill, and the product yield is increased.

Since extending outward from the lateral surface of the substrate body, the protruding structure will not occupy a region of the substrate body that is reserved for circuits or electrode pads to be disposed therewithin. Therefore, the region and function of the semiconductor substrate are not affected.

BRIEF DESCRIPTION OF DRAWINGS

The disclosure can be more fully understood by reading the following detailed description of the preferred embodiments, with reference made to the accompanying drawings, wherein:

FIG. 1' is a top view of the semiconductor package shown in FIG. 1, with the underfill omitted;

FIG. 2' shows another embodiment of FIG. 2;

DETAILED DESCRIPTION

The following illustrative embodiments are provided to illustrate the disclosure of the present disclosure, these and other advantages and effects can be apparently understood by those in the art after reading the disclosure of this specification. The present disclosure can also be performed or applied by other different embodiments. The details of the specification may be on the basis of different points and applications, and numerous modifications and variations can be devised without departing from the spirit of the present disclosure.

Figure 1:
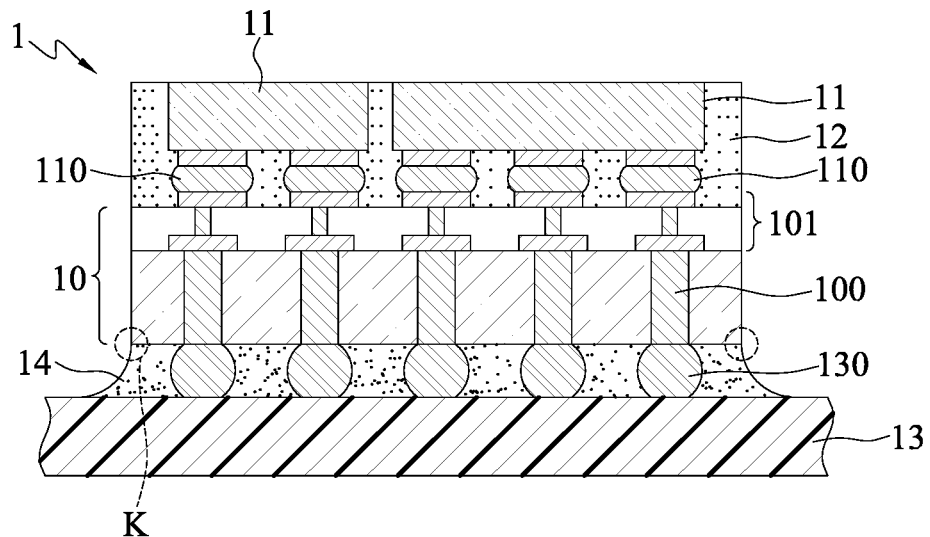
FIG. 1 is a cross-sectional view of a semiconductor package according to the prior art.
Figure 1:
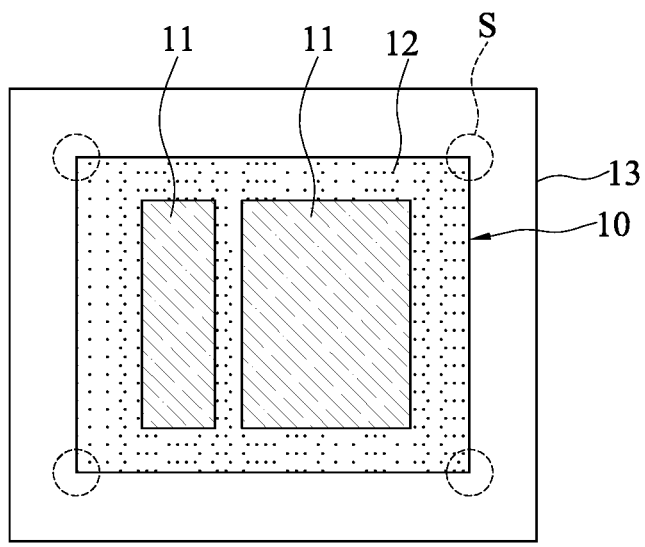
Figure 2:
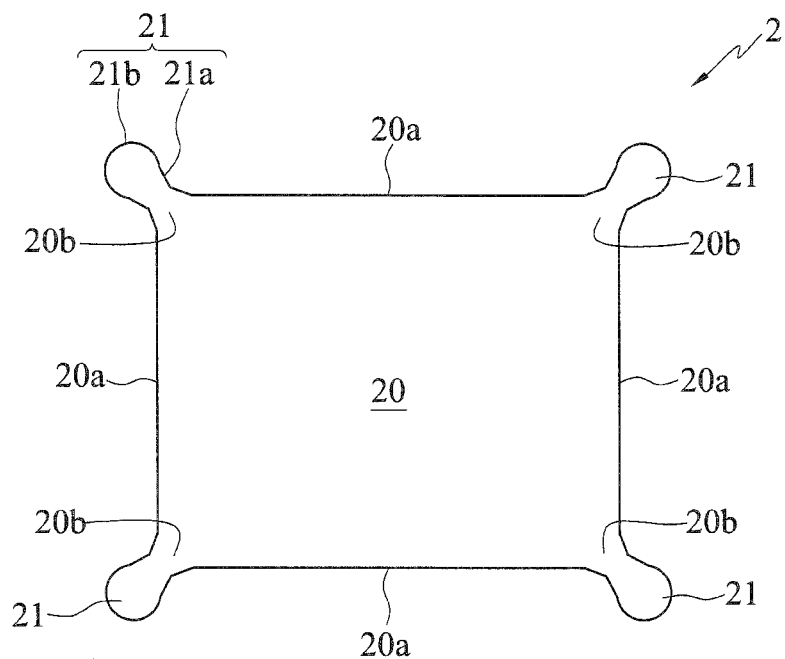
FIG. 2 is a top view of a semiconductor substrate according to the present disclosure.
Figure 2:
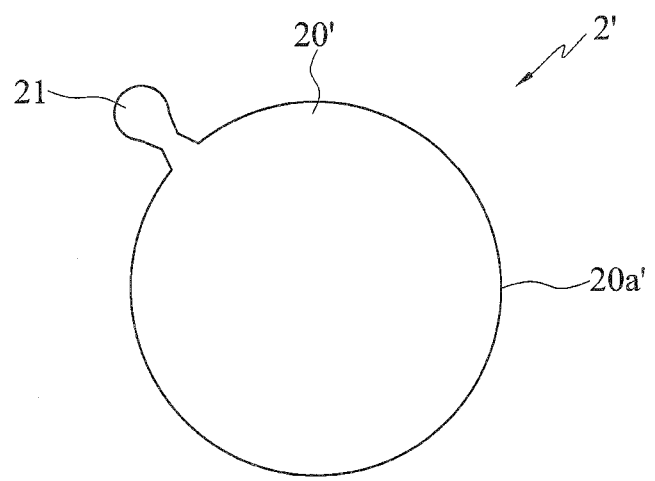

FIG. 2 is a top view of a semiconductor substrate 2 according to the present disclosure. The semiconductor substrate 2 comprises a substrate body 20 and a plurality of protruding structures 21.

In an embodiment, the substrate body 20 is a substrate containing silicon, such as a through silicon interposer (TSI), an active die, a passive die, or a glass substrate.

In an embodiment, the substrate body 20 has four lateral surfaces 20a, as indicated by a rectangular contour shown in FIG. 2.

The protruding structure 21 extends outward from the lateral surfaces 20a of the substrate body 20.

In an embodiment, the four lateral surfaces 20a of the substrate body 20 intersect to form four corners 20b, and the protruding structures 21 are disposed on the corners 20b correspondingly.

Figure 2A:
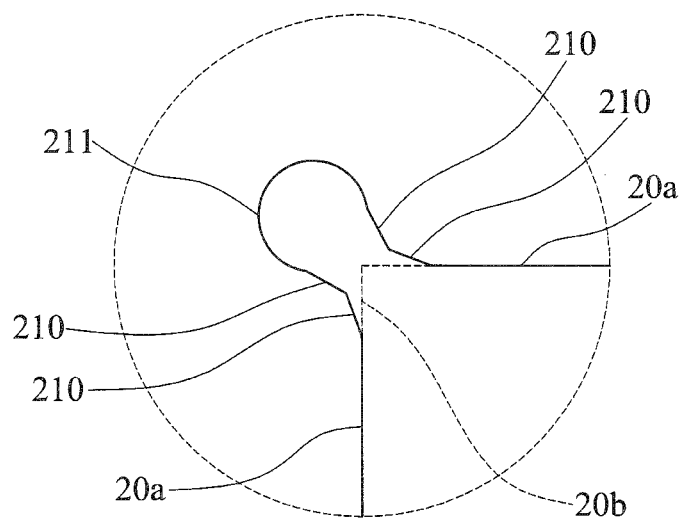
FIGS. 2A-2D are locally enlarged views showing different embodiments of FIG. 2.
Figure 2B:
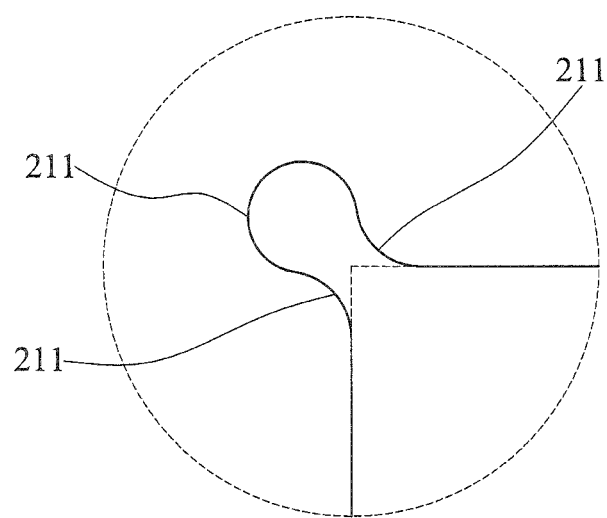
Figure 2C:
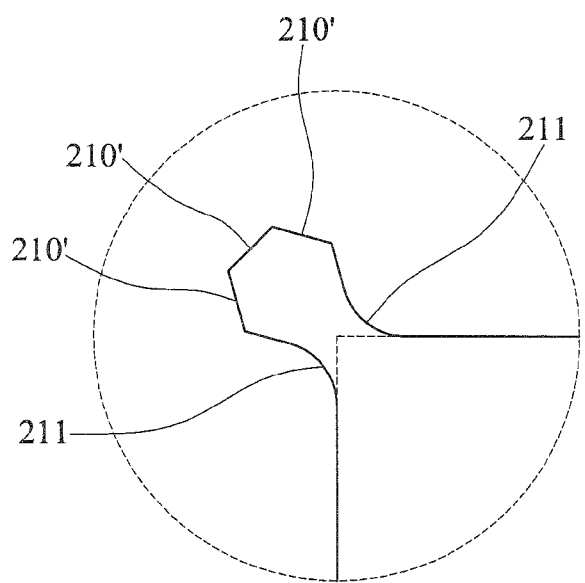
Figure 2D:
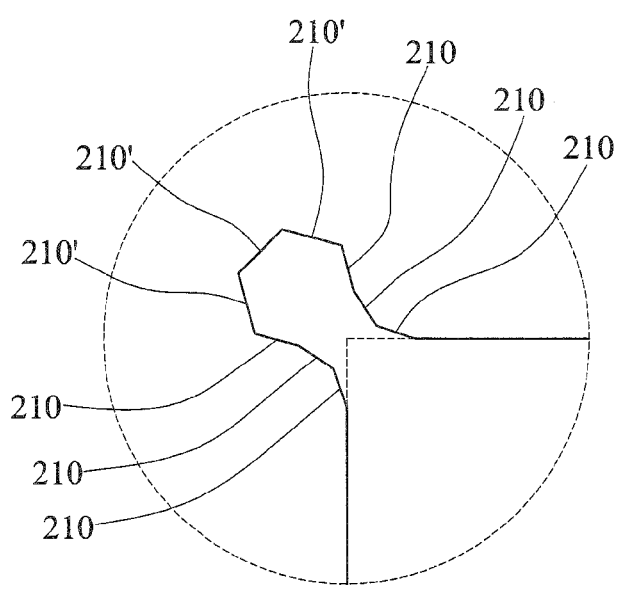

In an embodiment, the protruding structure 21 comprises a neck portion 21a connected to the substrate body 20, and a head portion 21b connected to the neck portion 21a. In another embodiment, the contour of the protruding structure 21 is composed of straight lines 210, 210', curved lines 211, or a combination thereof, as shown in FIGS. 2A-2D. As shown in FIGS. 2A and 2D, the neck portion 21a is in the shape of an obtuse polygon. As shown in FIGS. 2B and 2C, the neck portion 21a is in the shape of a rounded arc. Therefore, the protruding structure 21 in an embodiment is composed of rounded arcs and/or polygons. As shown in FIGS. 2A-2D, the neck portion 21a has at most ten straight lines 210 on a single side, preventing it from becoming an arc shape.

In another embodiment, as shown in a semiconductor substrate 2' of FIG. 2' the substrate body 20' has only one lateral surface 20a', such as a round contour, and the protruding structure 21 can be disposed anywhere on the lateral surface 20a' on demands.

Figure 3:
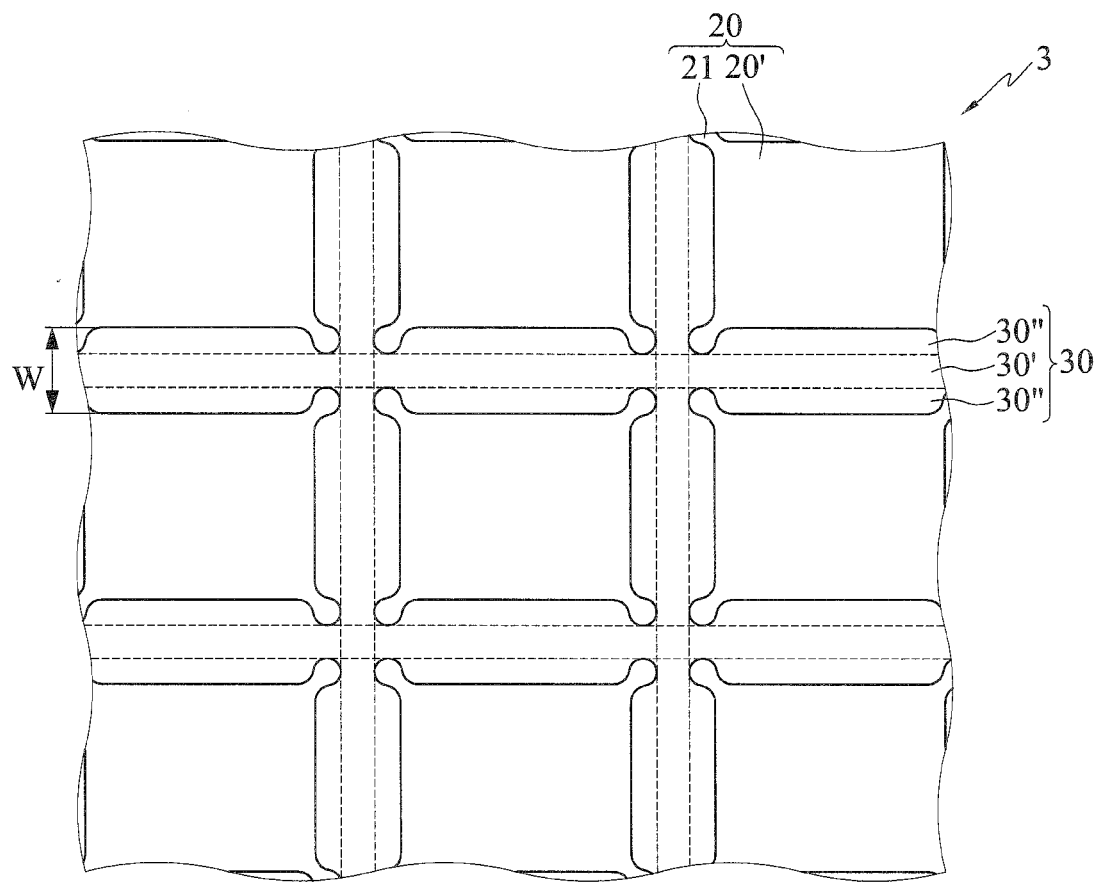
FIG. 3 is a top view showing a method of manufacturing a semiconductor substrate according to the present disclosure.

FIG. 3 shows how the semiconductor substrate 2 is manufactured. A complete panel 3 is provided. The complete panel 3 includes a plurality of substrate bodies 20 and a plurality of pre-scribing paths 30. In an embodiment, the pre-scribing paths 30 are 80-120 μm in width. A resist layer is formed in the pre-scribing paths 30. A plurality of protruding structures 21 and scribing paths 30' are formed by a dry etching process, such as a reactive ion etching (RIE) process and a plasma process. The resist layer is then removed. A singulation process is performed along the scribing paths 30', to singulate the semiconductor substrate 2. A pre-scribing path material 30" surrounding the semiconductor substrate 2 is removed. Therefore, the protruding structure 21 is integrated with the substrate body 20.

The semiconductor substrate 2, 2' according to the present disclosure use the protruding structure 21 to distribute stresses of the semiconductor substrate 2, 2' generated during subsequent processes, such that the problem that the stresses are concentrated on the corners is solved. Therefore, the semiconductor substrate 2, 2', after packaged, can be prevented from delamination or being cracked, and has a product yield increased.

Since protruding outward from the lateral surface 20a, 20a' of the substrate body 20, 20' and thus occupying the pre-scribing paths 30, the protruding structures 21 do not occupy a region of the substrate body 20, 20' that is reserved for circuits or electrode pads to be disposed therewithin. Therefore, the region and its function of the substrate body 20, 20' are not affected.

Figure 4:
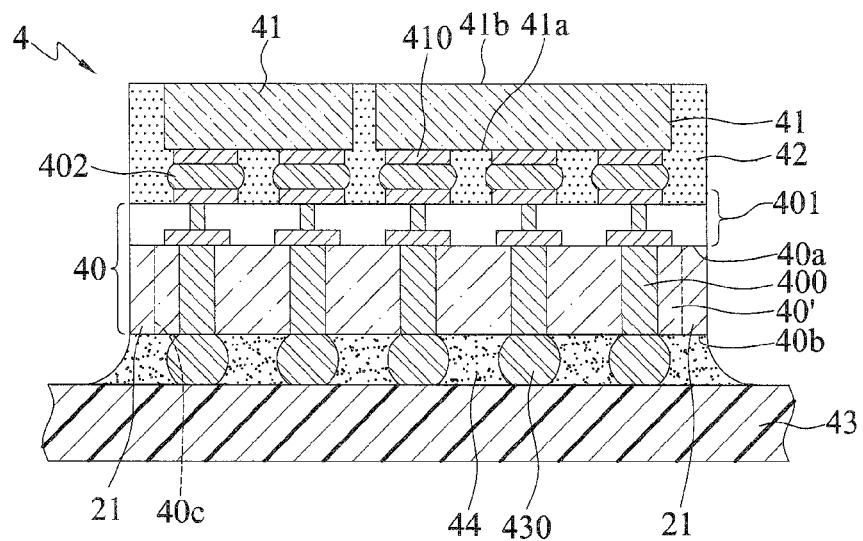
FIG. 4 is a cross-sectional view of an electronic package according to the present disclosure.

FIG. 4 is a cross-sectional view of an electronic package 4 according to the present disclosure. The electronic package 4 comprises a semiconductor substrate 40, at least one electronic component 41, and an encapsulation layer 42.

The semiconductor substrate 40 is similar to the structure shown in FIG. 2. A substrate body 40' has a first surface 40a and a second surface 40b opposing the first surface 40a. The semiconductor substrate 40 has lateral surfaces 40c adjacent the first surface 40a and the second surface 40b. The protruding structure 21 protrudes outward from the lateral surfaces 40c.

In an embodiment, the semiconductor substrate 40 has a plurality of circuits, such as a plurality of conductive through holes 400 in the substrate body 40' that penetrate the first and second surfaces 40a and 40b (i.e., connecting the first and second surfaces 40a and 40b). In an embodiment, the conductive through holes 400 are through-silicon vias (TSVs), and have two end surfaces flush with the first surface 40a and the second surface 40b of the substrate body 40', respectively.

In another embodiment, the circuits of the semiconductor substrate 40 can also be formed on the first surface 40a of the substrate body 40'. In an embodiment, a redistribution layer (RDL) process is performed, to form a redistribution structure 401, and the redistribution structure 401 is electrically connected to the conductive through holes 400.

In an embodiment, the electronic component 41 is disposed on the semiconductor substrate 40, and is an active component, a passive component, or a combination thereof. In an embodiment, the active component is a semiconductor die, and the passive component is a resistor, a capacitor or an inductor.

In an embodiment, the electronic component 41 is a semiconductor die that has an active surface 41a and a non-active surface 41b opposing the active surface 41a. The active surface 41a has a plurality of electrode pads 410. The electronic component 41 is coupled onto the redistribution structure 401 via electrode pads 410 and conductive elements 402 containing a solder tin material.

The encapsulation layer 42 is formed on the semiconductor substrate 4, and encapsulates the electronic components 41 and the conductive elements 402.

In an embodiment, the encapsulation layer 42 is made of polyimide (PI), a dry film, epoxy, or a packaging material.

In another embodiment, the electronic package 4 can also comprise a packaging substrate 43 disposed on a side opposing another side of semiconductor substrate 40 where the electronic component 41 is disposed (that is, the second surface 40b of the substrate body 40'). In an embodiment, the packaging substrate 43 is coupled and electrically connected to the conductive through holes 400 of the semiconductor substrate 40 via a plurality of conductive elements 430. An underfill 44 is formed between the packaging substrate 43 and the semiconductor substrate 40 to encapsulate the conductive elements 430. During a subsequent process, a plurality of solder balls (not shown) are disposed on a bottom side of the packaging substrate 43, for the electronic package 4 to be coupled to another circuit board (now shown).

Figure 5:
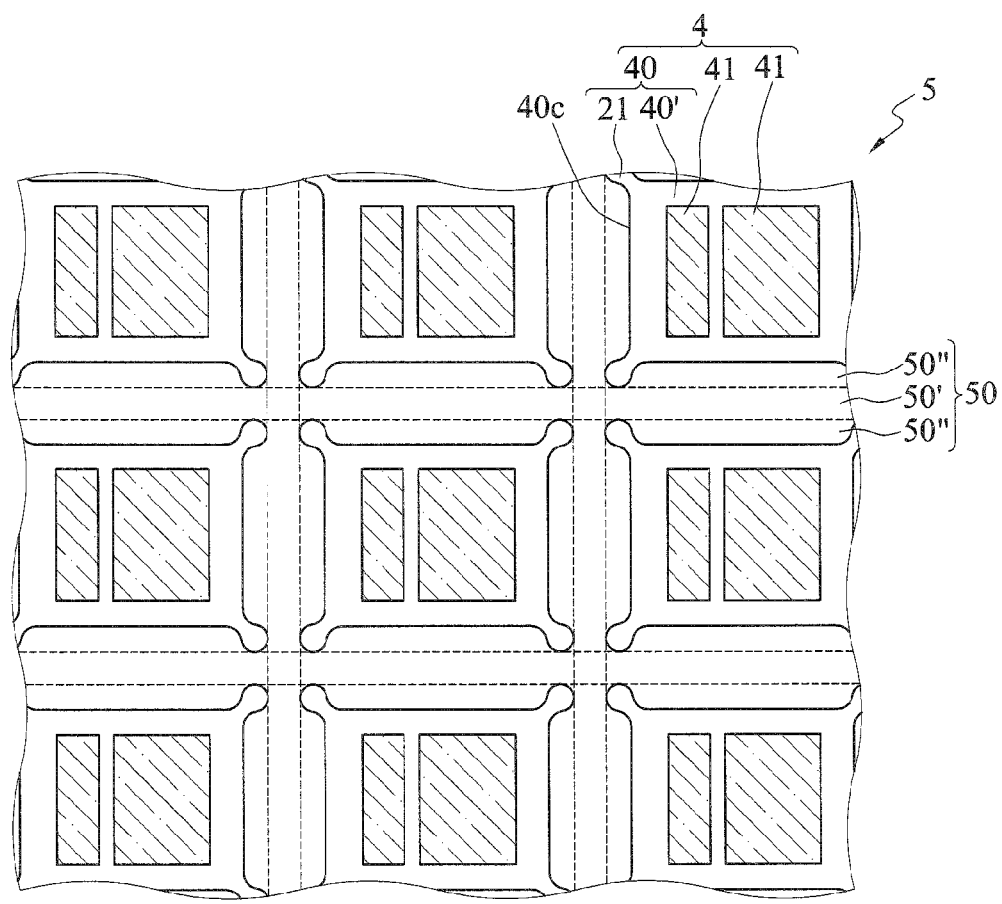
FIG. 5 is a top view showing a method of manufacturing an electronic package according to the present disclosure.

FIG. 5 shows how the electronic package 4 is manufactured. FIG. 5 does not show the encapsulation layer 42. A complete panel 5 is provided. The complete panel 5 comprises a plurality of substrate bodies 40' and a plurality pre-scribing paths 50. The electronic components are disposed on the substrate bodies 40'. The pre-scribing paths 50 are etched to form a plurality of protruding structures 21 and scribing paths 50'. A singulation process is performed along the scribing paths 50' to singulate the semiconductor substrates 40. A pre-scribing path material 50" surrounding the electronic package 4 is removed. The protruding structures 21 and scribing paths 50' are formed on the complete panel 5 first, and then the electronic components 41 are disposed on the substrate bodies 40'.

The encapsulation layer 42 is not etched during a dry etching process. Therefore, the protruding structures 21 and the scribing paths 50' are formed before the formation of the encapsulation layer 42. Alternatively, the encapsulation layer 42 can be formed first, and then protruding structure 21 and the scribing paths 50' are formed by other processes.

The electronic package 4 according to the present disclosure uses the protruding structure 21 to solve the stress concentration problem of the semiconductor substrate 40. Therefore, the semiconductor substrate 40, after packaged, will be neither cracked along the corners, nor delaminated from the encapsulation layer 42 (or the underfill 44) due to the CTE mismatch. As a result, the semiconductor substrate 40 can be electrically connected to the electronic component 41 and the packaging substrate 43 effectively, pass the reliability test, and have a product yield increased.

Since protruding to a region outside of the substrate body 40', and occupying the pre-scribing paths 50 only, the protruding structure 21 will not occupy a region of the substrate body 40' that is reserved for circuits or electrode pads to be disposed therewithin. Therefore, the region and its function of the semiconductor substrate 40 are not affected, and the circuit layout region of the substrate body 40' or the region where the electronic components 41 are disposed is not affected.

The electronic package and the semiconductor substrate according to the present disclosure use the protruding structure to solve the stress concentration problem, so as to increase the product yield. Besides, the original region and its function of the semiconductor substrate are not affected.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. A semiconductor substrate having a plurality of circuits, the semiconductor substrate comprising:
   a substrate body having a first surface, a second surface, and at least one lateral surface adjacent the first surface and the second surface; and
   at least one protruding structure extending outward from the lateral surface of the substrate body and occupying a pre-scribing path surrounding the substrate body.

2. The semiconductor substrate of claim 1, wherein the substrate body has a plurality of the lateral surfaces.

3. The semiconductor substrate of claim 2, wherein the plurality of the lateral surfaces intersect to form a corner, and the protruding structure is disposed on the corner.

4. The semiconductor substrate of claim 1, wherein the protruding structure is integrated with the substrate body.

5. The semiconductor substrate of claim 1, wherein the protruding structure has a contour composed of straight lines, curved lines, or a combination thereof.

6. The semiconductor substrate of claim 1, wherein the protruding structure comprises a neck portion connected to the lateral surface of the substrate body.

7. The semiconductor substrate of claim 1, wherein the protruding structure further comprises a head portion connected to the neck portion.

8. An electronic package, comprising:
   the semiconductor substrate according to claim 1;
   an electronic component disposed on the semiconductor substrate, wherein the circuits are electrically connected to the electronic component; and
   an encapsulation layer formed on the semiconductor substrate and encapsulating the electronic component.

9. The electronic package of claim 8, wherein the substrate body has a plurality of the lateral surfaces.

10. The electronic package of claim 9, wherein the plurality of the lateral surfaces intersect to form a corner, and the protruding structure is disposed on the corner.

11. The electronic package of claim 8, wherein the protruding structure is integrated with the substrate body.

12. The electronic package of claim 8, wherein the protruding structure has a contour composed of straight lines, curved lines, or a combination thereof.

13. The electronic package of claim 8, wherein the protruding structure comprises a neck portion connected to the lateral surface of the substrate body.

14. The electronic package of claim 13, wherein the protruding structure further comprises a head portion connected to the neck portion.

15. The electronic package of claim 8, further comprising a packaging substrate disposed on a side opposing another side of the semiconductor substrate with the electronic component disposed thereon.

16. The electronic package of claim 15, further comprising an underfill formed between the packaging substrate and the semiconductor substrate.

* * * * *